United States Patent
Allen et al.

(10) Patent No.: US 10,289,916 B2
(45) Date of Patent: May 14, 2019

(54) SYSTEM AND METHOD FOR EDITING VIDEO AND AUDIO CLIPS

(71) Applicant: Shred Video, Inc., San Carlos, CA (US)

(72) Inventors: Michael Allen, San Carlos, CA (US); Mark Godfrey, San Francisco, CA (US)

(73) Assignee: Shred Video, Inc., San Carlos, CA (US)

( * ) Notice: Subject to any disclaimer, the term of this patent is extended or adjusted under 35 U.S.C. 154(b) by 107 days.

(21) Appl. No.: 15/215,723

(22) Filed: Jul. 21, 2016

(65) Prior Publication Data

US 2017/0024615 A1    Jan. 26, 2017

Related U.S. Application Data

(60) Provisional application No. 62/195,112, filed on Jul. 21, 2015.

(51) Int. Cl.
| | |
|---|---|
| *H04N 5/93* | (2006.01) |
| *G06K 9/00* | (2006.01) |
| *G11B 27/034* | (2006.01) |
| *G11B 27/19* | (2006.01) |
| *H03K 19/177* | (2006.01) |
| *G06F 17/30* | (2006.01) |
| *G06K 9/62* | (2006.01) |

(52) U.S. Cl.
CPC ... *G06K 9/00765* (2013.01); *G06F 17/30743* (2013.01); *G06K 9/00711* (2013.01); *G06K 9/00718* (2013.01); *G06K 9/00744* (2013.01); *G06K 9/6215* (2013.01); *G11B 27/034* (2013.01); *G11B 27/19* (2013.01); *H03K 19/17708* (2013.01)

(58) Field of Classification Search
CPC .......... G06F 17/30743; G06K 9/00711; G06K 9/00718; G06K 9/00744; G06K 9/6215; G06K 9/00765; G11B 27/034; G11B 27/19; H03K 19/17708
USPC ......... 386/285, 338, 339; 281/1, 56; 84/612, 84/636
See application file for complete search history.

(56) References Cited

U.S. PATENT DOCUMENTS

| | | | |
|---|---|---|---|
| 6,542,869 B1 * | 4/2003 | Foote | G06F 17/30743 704/200.1 |
| 9,406,305 B2 * | 8/2016 | Kamath | G06Q 20/3829 |
| 2002/0181711 A1 * | 12/2002 | Logan | G11B 27/105 381/1 |

(Continued)

*Primary Examiner* — Helen Shibru
(74) *Attorney, Agent, or Firm* — Greenberg Traurig; Joshua Brown

(57) ABSTRACT

In accordance with an embodiment, a method is disclosed for detecting action in a video clip. An audio clip is extracted from the video clip. The audio clip is converted to an auditory spectrogram. The auditory spectrogram is used to construct a self-similarity matrix. The self-similarity matrix is then used to calculate a novelty curve. The clip is then segmented into segments according to peaks in the novelty curve. Each of segments is scored, and then classified as an action clip if the score is above or below a predetermined threshold. Related methods for folding a digitized song into a shorter version of itself and for sequencing a set of user-supplied video and photo clips to a user-supplied song are further disclosed.

7 Claims, 4 Drawing Sheets

(56) References Cited

U.S. PATENT DOCUMENTS

| | | | | |
|---|---|---|---|---|
| 2003/0161396 | A1* | 8/2003 | Foote | G06F 17/30017 375/240.01 |
| 2005/0249080 | A1* | 11/2005 | Foote | G06F 17/30743 369/59.1 |
| 2009/0259975 | A1* | 10/2009 | Asai | G06F 3/04815 715/850 |
| 2010/0183280 | A1* | 7/2010 | Beauregard | G11B 27/034 386/285 |
| 2013/0064379 | A1* | 3/2013 | Pardo | H04S 7/40 381/56 |
| 2014/0185862 | A1* | 7/2014 | Kamath | G10L 19/018 382/100 |
| 2015/0220633 | A1* | 8/2015 | Fuzell-Casey | G06F 17/30743 707/748 |
| 2015/0382274 | A1* | 12/2015 | Logvinov | H04L 41/0833 370/311 |
| 2017/0140260 | A1* | 5/2017 | Manning | G06N 3/04 |

* cited by examiner

SYSTEM AND METHOD FOR EDITING VIDEO AND AUDIO CLIPS

This application is a non-provisional of and claims priority to U.S. patent application Ser. No. 62/195,112, filed Jul. 21, 2015, which is incorporated herein by reference in its entirety.

This application includes material which is subject to copyright protection. The copyright owner has no objection to the facsimile reproduction by anyone of the patent disclosure, as it appears in the Patent and Trademark Office files or records, but otherwise reserves all copyright rights whatsoever.

FIELD

The present invention relates in general to the field of methods and devices for editing video and audio clips. In various embodiments, the methods herein may be applied for automated or semi-automated editing down of video and audio clips generated by a wearable video recorder, mobile phone, or other mobile device with video recording capability. The techniques described herein are particularly advantageous for use in editing action footage.

BRIEF DESCRIPTION OF THE DRAWINGS

Objects, features, and advantages of the invention will be apparent from the following more particular description of preferred embodiments as illustrated in the accompanying drawings, in which reference characters refer to the same parts throughout the various views. The drawings are not necessarily to scale, emphasis instead being placed upon illustrating principles of the invention.

DETAILED DESCRIPTION

Reference will now be made in detail to the preferred embodiments of the present invention, examples of which are illustrated in the accompanying drawings. The following description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "an embodiment" or "the embodiment" means that a particular feature, structure, or characteristic described in connection with the embodiment is included in at least an embodiment of the disclosure. The appearances of the phrase "in an embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The present invention is described below with reference to block diagrams and operational illustrations of methods and devices editing video clips. It is understood that each block of the block diagrams or operational illustrations, and combinations of blocks in the block diagrams or operational illustrations, may be implemented by means of analog or digital hardware and computer program instructions. These computer program instructions may be stored on computer-readable media and provided to a processor of a general purpose computer, special purpose computer, ASIC, or other programmable data processing apparatus, such that the instructions, which execute via the processor of the computer or other programmable data processing apparatus, implements the functions/acts specified in the block diagrams or operational block or blocks. In some alternate implementations, the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved.

Described below are novel techniques for action detection, song folding, and sequencing a set of user-supplied video and photo clips to a user-supplied song.

Action Detection

Figure 1:
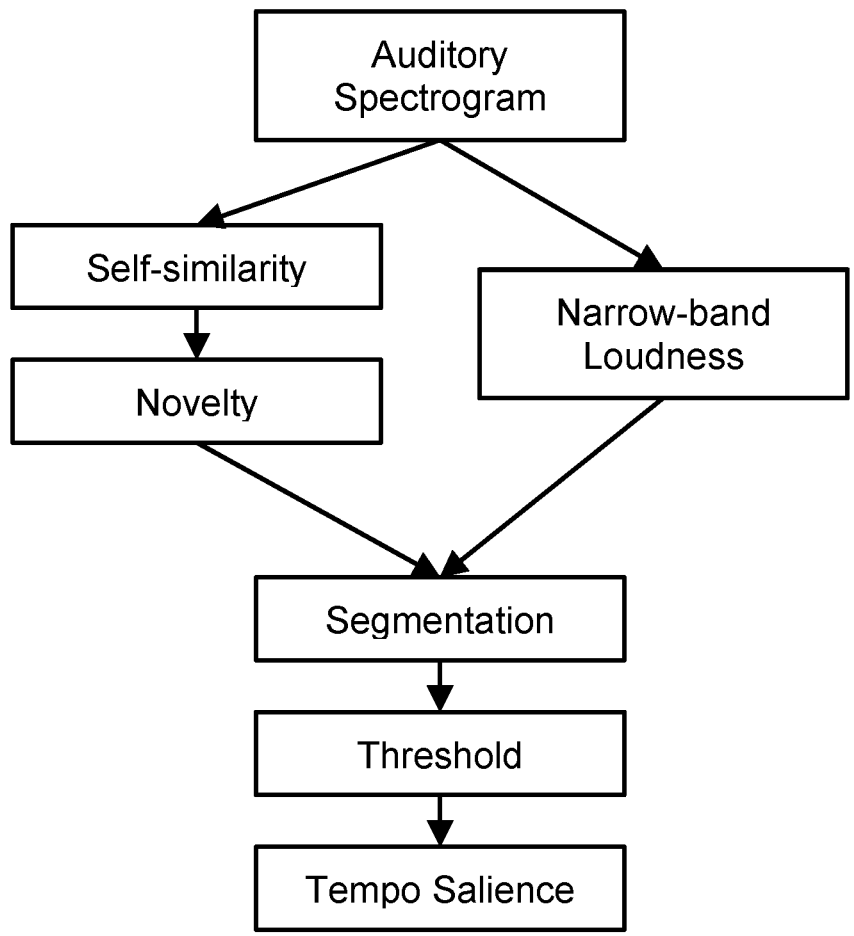
FIG. 1 shows a flow diagram illustrating an embodiment of an action detection process.

With reference to FIG. 1, in an embodiment, audio is extracted from a video clip and resampled to 44.1 kHz sampling rate. The audio clip is then converted into a representation that models how a human brain perceives it, a representation known as an "auditory spectrogram". First, a short-time Fourier transform is taken of the audio clip, with a window size of 16384 samples (0.372 seconds) at 50% overlap, offering a time resolution of 0.186 seconds. This spectrogram is converted to the auditory representation by first taking the power of each frame, weighting the frames by frequency according to established equal-loudness models (Terhardt), averaging frequency bins into 24 bins spaced along the Bark scale, and applying a spreading function to account for frequency masking effects in the ear.

Next, a self-similarity matrix is constructed. This matrix defines how similar each frame in the audio clip is to each other frame. In an embodiment, the cosine similarity metric is used to calculate the similarity between each frame in the auditory spectrogram.

Next, a novelty curve is calculated. In an embodiment, the curve is calculated by cross-correlating a 16×16 Gaussian-weighted checker-board kernel down the diagonal of the self-similarity matrix (Foote). This curve is meant to capture points in the audio clip where events occur that transition the clip from one state to another. These boundary points appear as peaks in the novelty curve, moments where there is substantial self-similarity before and after the boundary and little similarity between the two sections. For example, when a surfer goes from paddling to standing/riding, we expect to see a peak in the novelty curve, audio frames while paddling sound similar to one another, as do frames while riding a wave, but frames from either section to not sound similar to one another.

In an embodiment, a narrow-band loudness curve across the audio clip is also calculated. This is found by summing the power in Bark bands 2 through 4 in the auditory spectrogram. This corresponds to a frequency band of 200-510 Hz, and captures the relatively low-frequency rumble we look for in high-speed action.

Next, the clip is segmented according to the peaks in the novelty curve. The peaks are first filtered by removing the bottom 50% of the peaks sorted by strength. The process then considers each the region between each novelty peak to be an audio segment. These segments are then agglomerated iteratively until all segments meet a minimum duration, which is set to ½0th of the total duration of the clip.

The novelty and narrow-band loudness are then averaged for each segment. Each segment is then given an action score that is a weighted average of the normalized novelty and loudness. The weights are determined first by computing an overall wide-band loudness value for the entire track. This weighting is essentially looking for segments of low novelty (smooth sounding, not much spurious bursts of sound) and low-frequency intensity, which in practice often corresponds to the segments of high action, e.g., on the surfboard riding a wave, racing down a mountain on a snowboard, etc. In an embodiment, for clips that are generally loud throughout, the system is configured to rely more on the novelty score; for quiet clips, it gives more weight to the loudness.

$L\text{total}=\text{median}(Lwb)$ $\alpha=0.7, L\text{total}>-12 \text{ dB}$ $\alpha=0.3, L\text{total}<=-12 \text{ dB}$ $A=\alpha*N+(1-\alpha)*(1-Lnb)$ Each segment is then classified as an action clip if its action score is under an empirically determined threshold, set to 0.25.

Figure 2:
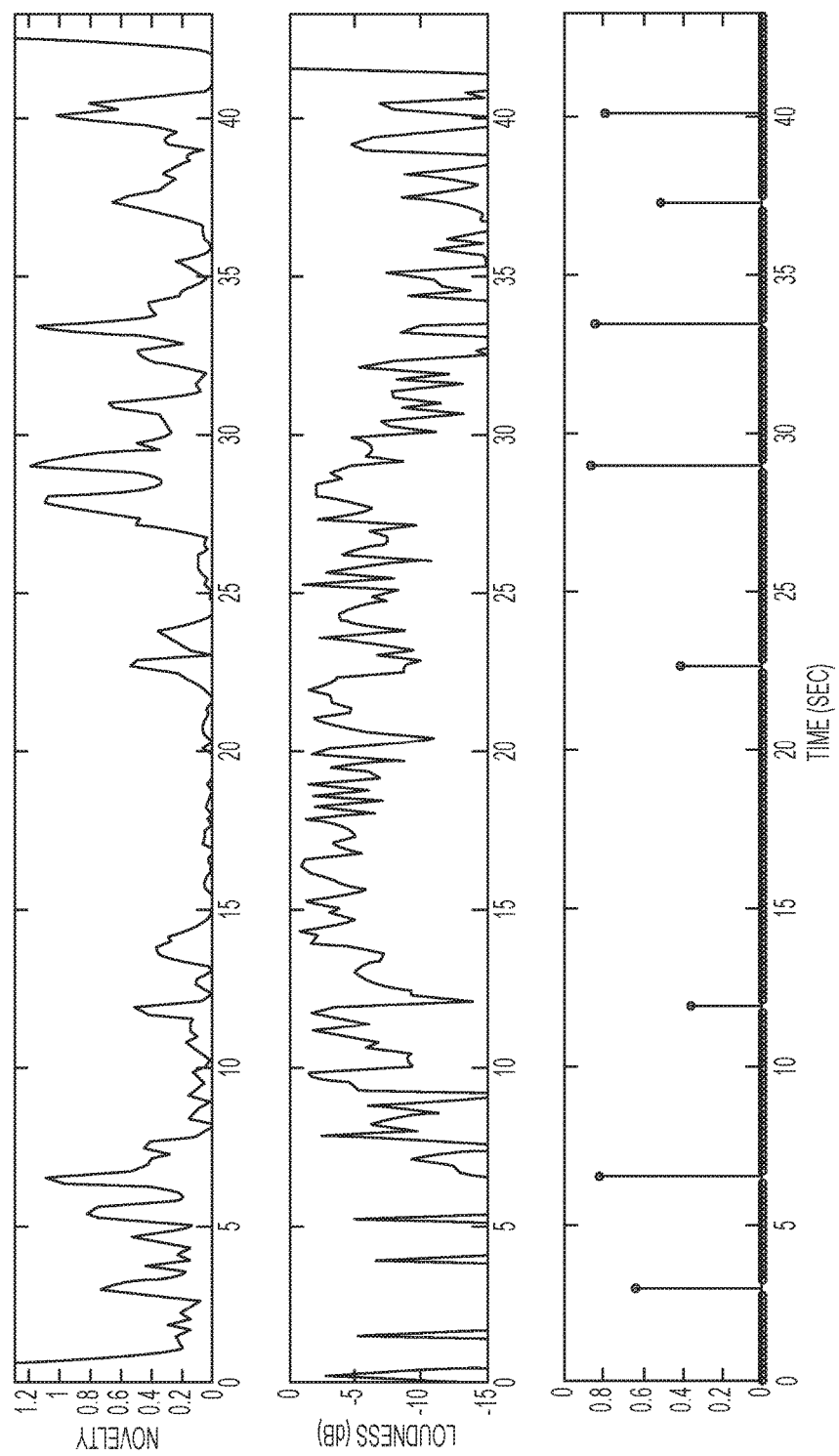
FIG. 2 shows graphical representations of novelty and narrow-band loudness curves for an exemplary clip.

FIG. 2 shows the novelty and narrow-band loudness curves for an example 42 second surf clip. The last row shows the resulting segmentation. It is clear that the segment with the lowest novelty and highest loudness is between ~11 and ~23 seconds in the clip, which is the peak action segment where the rider is standing and riding the wave.

The presence of music in a segment can often trigger false positives in the action detection. Therefore, in an embodiment, the system is configured to post-process the detected action clips by computing the tempo salience via an autocorrelation of the onset detection function (described in the song analysis section below). The height of the highest peak in the autocorrelation in the allowable tempo range (70-140 bpm) is considered the tempo salience. If this is greater than an empirically set threshold of 0.45, for example, the system decides that the clip contains music and therefore disqualifies it from labeling as containing action.

Song Folding

Figure 3:
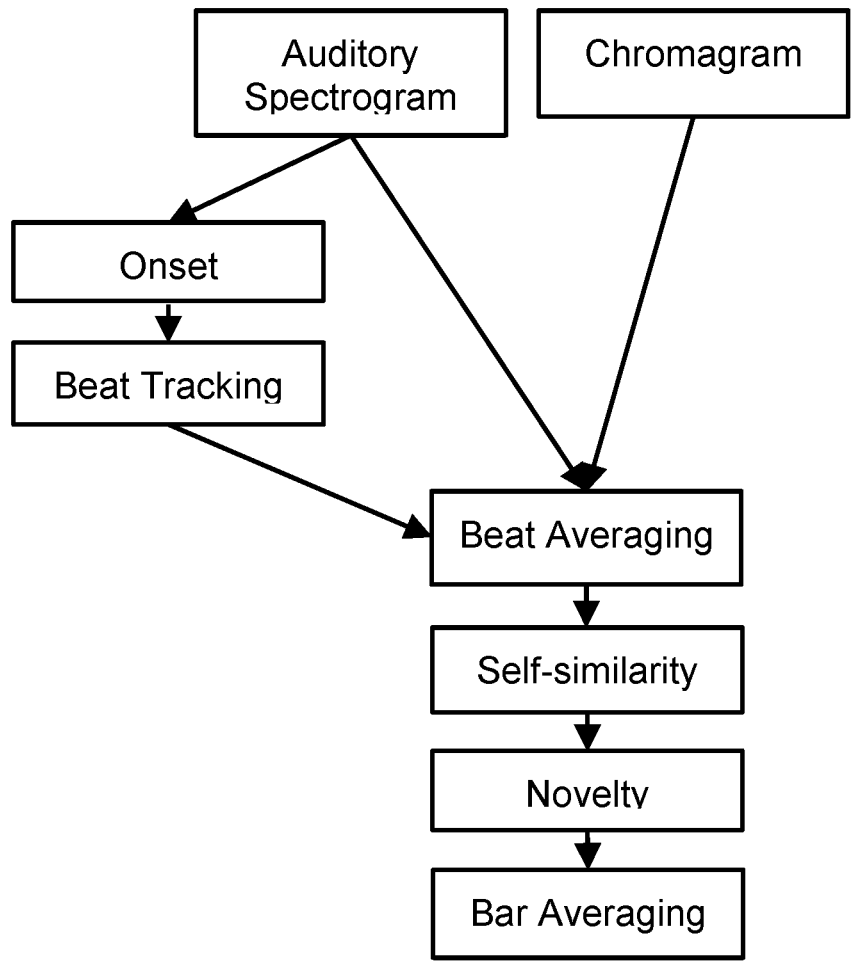
FIGS. 3 and 4 show flow diagrams illustrating processes for song folding.
Figure 4:
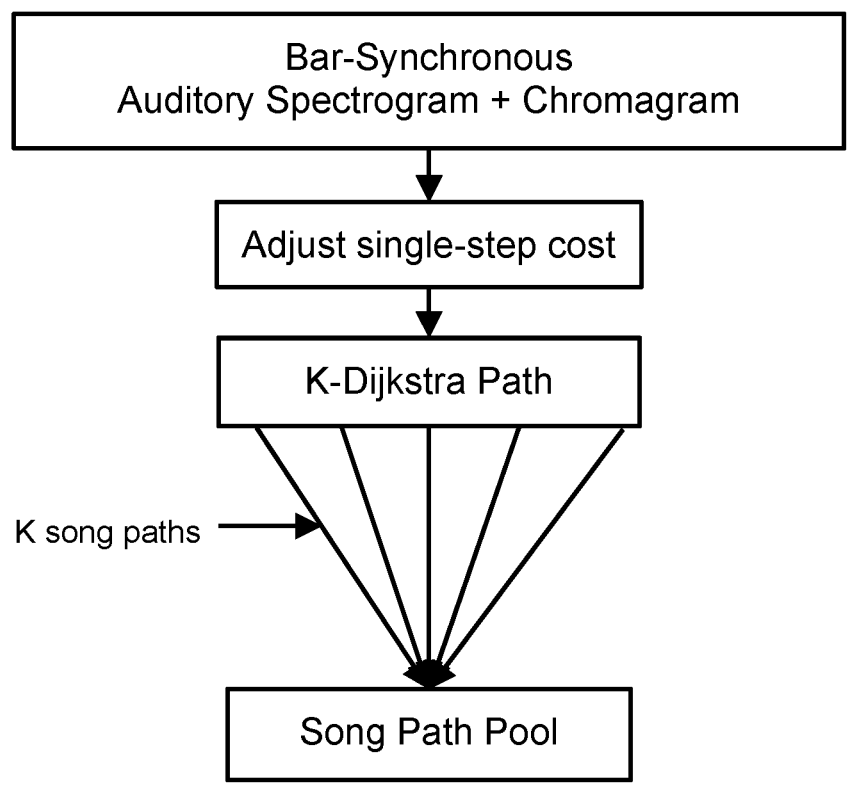

With reference to FIGS. 3 and 4, described below are examples of novel processes by which a musical song can be "folded" into a shorter version of itself by removing redundant audio regions.

First, an auditory spectrogram is calculated using the same method as in the action detection described above, however shorter windows are used (8192 or 0.1857 seconds with an overlap of 1.56% for a time-resolution of 3 ms).

Using the auditory spectrogram, we compute an onset detection function by computing the difference between each neighboring frame per Bark band. The function is half-wave rectified and a nonlinearity is applied to accentuate wide-band onsets.

A tempo estimate found by taking the autocorrelation of the onset detection function and finding the peak in the allowable tempo range (70-140 bpm). This tempo estimate is then used to guide beat-tracking by using a dynamic programming based approach that looks for beat locations that follow the tempo estimate while also occurring near peaks in the onset detection function.

While the auditory spectrogram is meant to model the timbre of the audio, we also model the musical pitch content by computing a chromagram of the signal. First, the Constant Q transform is applied to the raw spectrogram in the frequency range 27.5 Hz to 3520 Hz, essentially summing the power in logarithmically equal-spaced frequency bins. In an embodiment, the bins are spaced according to the musical semitone so there are 12 bins per octave. The bins are then circularly folded into one octave.

The frames of the auditory spectrogram and chromagram are then averaged according to the beat locations found from the beat-tracker. These beat-synchronous spectrograms are then used to compute a beat-synchronous self-similarity matrix, using the cosine distance and a linear weighting of the auditory spectrogram and chromagram frames.

In an embodiment, a novelty curve is computed again (in a manner identical to the action detection) and is used to find bar locations. Here, peaks in novelty may correspond to the beginnings of musical bars. A new bar-synchronous self-similarity matrix is then computed based on averaging the diagonal of each bar in the beat-synchronous self-similarity matrix.

The bar-synchronous self-similarity matrix is then interpreted as a directed graph, where the inverse similarity is considered the cost of "traveling" from one musical bar to another. The K-Dijkstra algorithm is then used to find the K best paths through the graph. Only vertices between increasing indexed nodes are allowed so that paths must move forward chronologically through the song. The paths are further limited to start from a bar in the first 32 bars and end at the last bar of the original song. This process is repeated many times, each time manually manipulating the cost of traveling a single step to increasingly weight against taking the typical straight path through the song. We are then left with a pool of available "song paths" each corresponding to a reduced-length version of the original song and scored by the total cost of traveling the path. These paths, each basically a sequence of musical bars, are then rendered with short cross-fades between bars to yield a track used as backing music in the final video montages.

Sequencing

Below is described a method of sequencing a set of user-supplied video and photo clips to a user-supplied song.

Given a target duration (e.g., 90 seconds), a user-supplied song is "folded" into a shorter version of itself. This may be performed, for example, according to the above method. The system then determines an appropriate structural representation of this song path. A novelty curve is computed (as described above) according to the bar-synchronous self-similarity matrix for a given song path. Peaks are found in the novelty curve and the song is segmented based on these boundaries, referring to each resulting segment as a "song section". These should roughly align with intuitive song sections, such as intro, verse, chorus, and bridge. In an embodiment, the maximum number of allowed sections is set to 10.

Each song section is then mapped to a particular clip type: action, B-roll (i.e. not action), or photo.

Action detection is run on each user-supplied video, determining which segments, if any, contain strong action footage. For less than 30 seconds of footage where action was detected, 1 song section is assigned to be mapped to action footage. For between 30 and 60 seconds of action footage, we map 2 song sections to action. Otherwise, we map 3 song sections to action. To determine which song sections are assigned to action footage, we calculate the wide-band loudness curve by summing the auditory spectrum across all Bark bands. Then on each song section boundary we find use a weighted first difference function $$D[i]=L[i]-\alpha*L[i-1]$$

where α was determined empirically to be 0.2. This function is maximal on section boundaries where an increase in loudness occurs and the final loudness is absolutely loud. The sections with the highest value according to this function are mapped to action footage.

The remaining song sections are mapped to clip types according to custom stochastic sequencing logic. A probability of assigning a song section to B-roll or photo is set by a nonlinear function of the total available duration of B-roll footage and number of photos supplied. The probability of assigning a section to B-roll is 0 for duration less than 30 seconds, 0.5 for B-roll duration 30-180 seconds, 0.7 for duration 180-300 seconds, and 0.8 for more than 300 seconds of B-roll footage. The total number of allowed photo sections is 1 for between 1-15 photos, 2 for between 15-30 photos, and unlimited for more than 30 photos. The sequencing is further constrained to force the first song section to always map to B-roll footage when available.

Within each song section, the footage is sequenced according to defined "clip rhythms". A clip rhythm is a set of parameters that defines how clips will be sequenced in time. A basic example of a clip rhythm is to play a new clip for each bar in the song section. A more complex rhythm would be play the first clip at a playback rate of ⅓ normal speed for 4 bars, then play the next clips at normal speed with a repeating pattern of 2 bars then 1 bar in duration. Each song section's clip type determines the type of rhythms allowed: action sections typically employ more slow-motion, photo sections have faster transitions. Each time a video is sequenced, rhythms are chosen for each section stochastically from a manually defined set.

Since the clips were obviously not shot in multiples of the musical bars, we cut subclips from the footage to match the duration of clip the chosen rhythm calls for. For action shots, we take the center of the detected action segment. For B-roll, we take a random region from the center 80% of the clip's duration.

At least some aspects disclosed above can be embodied, at least in part, in software. That is, the techniques above may be carried out in a special purpose or general purpose computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system, firmware, ROM, middleware, service delivery platform, SDK (Software Development Kit) component, web services, or other specific application, component, program, object, module or sequence of instructions referred to as "computer programs." Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A machine-readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer-to-peer networks. Different portions of the data and instructions can be obtained from different centralized servers and/or peer-to-peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine-readable medium in entirety at a particular instance of time.

Examples of computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROMS), Digital Versatile Disks (DVDs), etc.), among others.

In general, a machine readable medium includes any mechanism that provides (e.g., stores) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above embodiments and preferences are illustrative of the present invention. It is neither necessary, nor intended for this patent to outline or define every possible combination or embodiment. The inventor has disclosed sufficient information to permit one skilled in the art to practice at least one embodiment of the invention. The above description and drawings are merely illustrative of the present invention and that changes in components, structure and procedure are possible without departing from the scope of the present invention as defined in the following claims. For example, elements and/or steps described above and/or in the following claims in a particular order may be practiced in a different order without departing from the invention. Thus, while the invention has been particularly shown and described with reference to embodiments thereof, it will be understood by those skilled in the art that various changes in form and details may be made therein without departing from the spirit and scope of the invention.

What is claimed is:

1. A method for folding a digitized song into a shorter version of itself, comprising:
converting the digitized song to an auditory spectrogram;
using the auditory spectrogram to compute an onset detection function;

using the onset detection function to determine a tempo estimate;

identifying beat locations that follow the tempo estimate;

using the beat locations to compute a beat-synchronous self-similarity matrix;

finding a plurality of bar locations in the digitized song;

using the plurality of bar locations and the beat-synchronous self-similarity matrix to compute a bar-synchronous self-similarity matrix;

interpreting the bar-synchronous self-similarity matrix as a directed graph with a plurality of nodes, wherein each of the plurality of bar locations corresponds to a node in the plurality of nodes and wherein one or more inverse similarity values are assigned to one or more edges between the plurality of nodes;

applying a Dijkstra algorithm to find a selected path through the directed graph, wherein the selected path comprises an ordered subset of the plurality of nodes wherein each node in the ordered subset corresponds to a selected bar location of the plurality of bar locations; and, rendering the shorter version of the digitized song by sequencing the selected bar locations corresponding to the ordered subset.

2. The method of claim 1, wherein a novelty curve is used to find the plurality of bar locations in the digitized song.

3. The method of claim 1, further comprising adding cross-fades between the selected bar locations.

4. The method of claim 1, wherein each of the one or more edges connects a first node corresponding to a first bar location of the plurality bar locations with a second node corresponding to a second bar location of the plurality of bar locations.

5. The method of claim 4, wherein the first bar location must be earlier in the digitized song than the second bar location.

6. The method of claim 5, wherein the selected path begins with a start node that corresponds to a start bar location within a first 32 bars of the digitized song.

7. The method of claim 5, wherein the selected path ends with an end node corresponding to a last bar of the digitized song.

* * * * *